US011789341B2

(12) United States Patent
Van der Sijde et al.

(10) Patent No.: US 11,789,341 B2
(45) Date of Patent: Oct. 17, 2023

(54) DUAL JUNCTION LED WITH NON-OVERLAPPING SEGMENTATION

(71) Applicant: Lumileds LLC, San Jose, CA (US)

(72) Inventors: Arjen Gerben Van der Sijde, Eindhoven (NL); Nicola Bettina Pfeffer, Eindhoven (NL); Erik William Young, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/982,011

(22) Filed: Nov. 7, 2022

(65) Prior Publication Data

US 2023/0147783 A1    May 11, 2023

Related U.S. Application Data

(60) Provisional application No. 63/276,834, filed on Nov. 8, 2021.

(51) Int. Cl.

| | |
|---|---|
| *H01L 33/44* | (2010.01) |
| *G03B 15/05* | (2021.01) |
| *H01L 27/15* | (2006.01) |
| *H01L 33/38* | (2010.01) |

(52) U.S. Cl.
CPC ............ *G03B 15/05* (2013.01); *H01L 27/15* (2013.01); *H01L 33/382* (2013.01); *H01L 33/44* (2013.01); *H01L 2933/0016* (2013.01); *H01L 2933/0025* (2013.01)

(58) Field of Classification Search
CPC ........ H01L 33/382; H01L 33/44; H01L 27/15
USPC ............................................................ 362/3
See application file for complete search history.

(56) References Cited

U.S. PATENT DOCUMENTS

| | | | |
|---|---|---|---|
| 2012/0280261 A1 | 11/2012 | Tarsa et al. | |
| 2014/0159063 A1* | 6/2014 | Odnoblyudov | ....... H01L 33/405 |
| | | | 438/460 |
| 2014/0264804 A1* | 9/2014 | Terrill | ..................... H01L 24/36 |
| | | | 257/676 |

(Continued)

OTHER PUBLICATIONS

"International Application Serial No. PCT/US2022/049111, International Search Report dated Mar. 15, 2023", 4 pgs.

(Continued)

*Primary Examiner* — Christopher M Raabe
(74) *Attorney, Agent, or Firm* — Schwegman, Lundberg & Woessner, P.A.

(57) ABSTRACT

An illumination system can include a dual junction light-emitting diode (LED) array including first and second junctions that extend in a plane. The first junction can emit first light from a plurality of first light-emitting areas that are separated by first boundaries. The second junction can be disposed on the first junction such that the first light passes through the second junction. The second junction can emit second light from a plurality of second light-emitting areas. The second light-emitting areas can be separated by second boundaries that correspond in a one-to-one correspondence to the first boundaries. The second boundaries can be offset in the plane from the corresponding first boundaries. The offset can help reduce or eliminate dark bands in the combined first and second light, which could be present if the second boundaries were not offset from the first boundaries.

20 Claims, 17 Drawing Sheets

(56) References Cited

U.S. PATENT DOCUMENTS

| | | |
|---|---|---|
| 2014/0363912 A1* | 12/2014 | Ohlsson ............. H01L 33/0025 |
| | | 438/34 |
| 2017/0170375 A1 | 6/2017 | Huang et al. |
| 2018/0190880 A1 | 7/2018 | Vampola et al. |
| 2020/0328333 A1 | 10/2020 | Shimizu et al. |
| 2020/0350477 A1 | 11/2020 | Shim et al. |
| 2021/0408101 A1* | 12/2021 | Lee ....................... H01L 27/153 |
| 2022/0037393 A1* | 2/2022 | Robin .................... H01L 27/15 |
| 2023/0111380 A1* | 4/2023 | Kim ........................ H01L 33/38 |
| | | 257/13 |

OTHER PUBLICATIONS

"International Application Serial No. PCT/US2022/049111, Written Opinion dated Mar. 15, 2023", 3 pgs.

* cited by examiner

US 11,789,341 B2

DUAL JUNCTION LED WITH NON-OVERLAPPING SEGMENTATION

CROSS-REFERENCE TO RELATED APPLICATION

This application claims the benefit of U.S. Provisional Application No. 63/276,834, filed on Nov. 8, 2021, the entirety of which is hereby incorporated by reference herein.

FIELD OF THE DISCLOSURE

The present disclosure relates to an illumination system, such as for a camera.

BACKGROUND OF THE DISCLOSURE

There is ongoing effort to improve illumination systems, such as for cameras.

BRIEF DESCRIPTION OF THE DRAWINGS

Corresponding reference characters indicate corresponding parts throughout the several views. Elements in the drawings are not necessarily drawn to scale. The configurations shown in the drawings are merely examples and should not be construed as limiting in any manner.

DETAILED DESCRIPTION

In an example, an illumination system can include a dual-junction light-emitting diode (LED) array including first and second junctions that extend in a plane. The first junction can emit first light from a plurality of first light-emitting areas that are separated by first boundaries. The second junction can be disposed on the first junction such that the first light passes through the second junction. The second junction can emit second light from a plurality of second light-emitting areas. The second light-emitting areas can be separated by second boundaries that correspond in a one-to-one correspondence to the first boundaries. The second boundaries can be offset in the plane from the corresponding first boundaries. The offset can help reduce or eliminate dark bands in the combined first and second light, which could be present if the second boundaries were not offset from the first boundaries.

Figure 1:
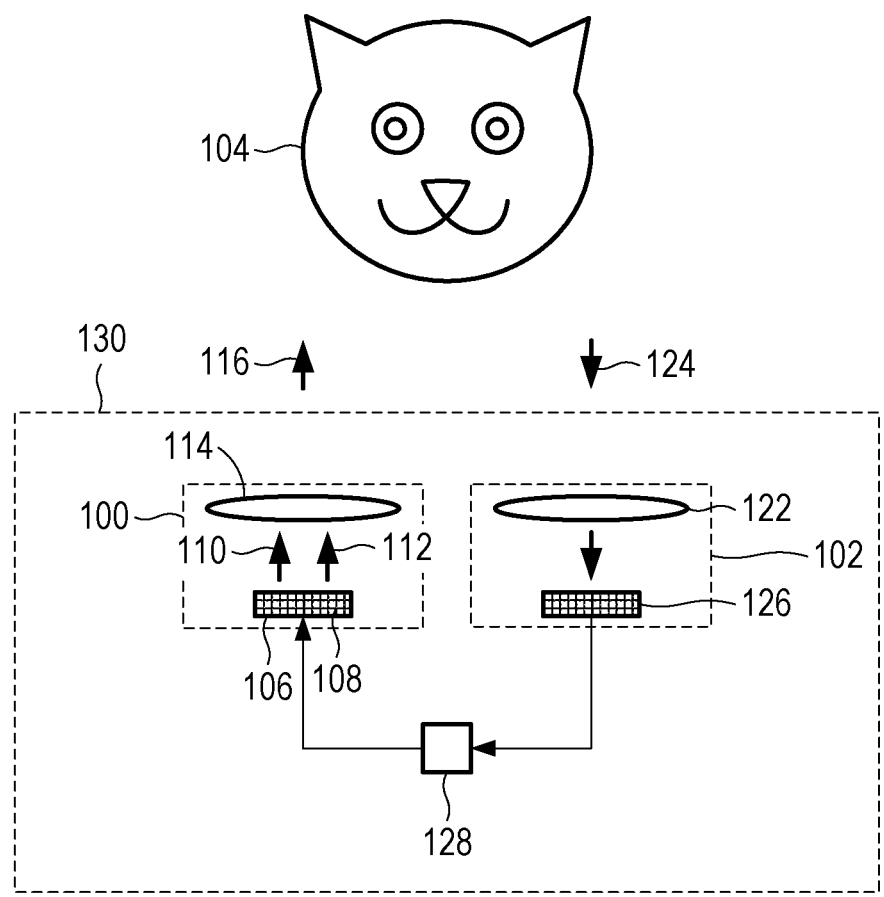
FIG. 1 shows a side view of an example of an illumination system, in accordance with some examples.

FIG. 1 shows a side view of an example of an illumination system 100, in accordance with some examples.

A dual junction light-emitting diode (LED) array 106 (hereinafter referred to as an "LED array") can include a first junction and a second junction that extend in a plane. The first junction can emit first light 110 from a plurality of first light-emitting areas (hereinafter referred to as "LEDs"). The first junction can emit first light from a plurality of first light-emitting areas that are separated by first boundaries (e.g., areas that do not emit light). The second junction can be disposed on the first junction such that the first light passes through the second junction. The second junction can emit second light 112 from a plurality of second light-emitting areas (also referred to as "LEDs"). The second light-emitting areas can be separated by second boundaries that correspond in a one-to-one correspondence to the first boundaries. The second boundaries can be offset in the plane from the corresponding first boundaries. A lens 114 can direct the first light 110 and the second light 112 toward a scene 104 as illumination 116. In the example of FIG. 1, the scene 104 includes a happy cat. Other suitable scenes can also be used. The LED array 106 and its structure are described in detail in FIGS. 2-13 below.

A camera 102 can include a camera lens 122 that can collect reflected light 124 that is reflected from and/or emitted by the scene 104. The camera lens 122 can direct the reflect light 124 onto a multi-pixel sensor 126 to form an image of the scene 104 on the multi-pixel sensor 126. A controller 128 can receive a data signal that represents the image of the scene 104. The controller 128 can drive the LEDs 108 in the LED array 106. For example, the controller can optionally control one or more LEDs 108 in the LED array 106 independent of another one or more LEDs 108 in the LED array 106, so as to illuminate the scene in a specified manner. For example, relatively close objects in the scene 104 may require a first amount of illumination, and relatively distant objects in the scene 104 may require a second amount of illumination, greater than the first amount, to have a same brightness in the image of the scene 104. Other configurations are also possible. The camera 102 and illumination system 100 can be disposed in a housing 130. In some examples, the housing 130 can be configured as a smart phone or other suitable device.

Figure 2:
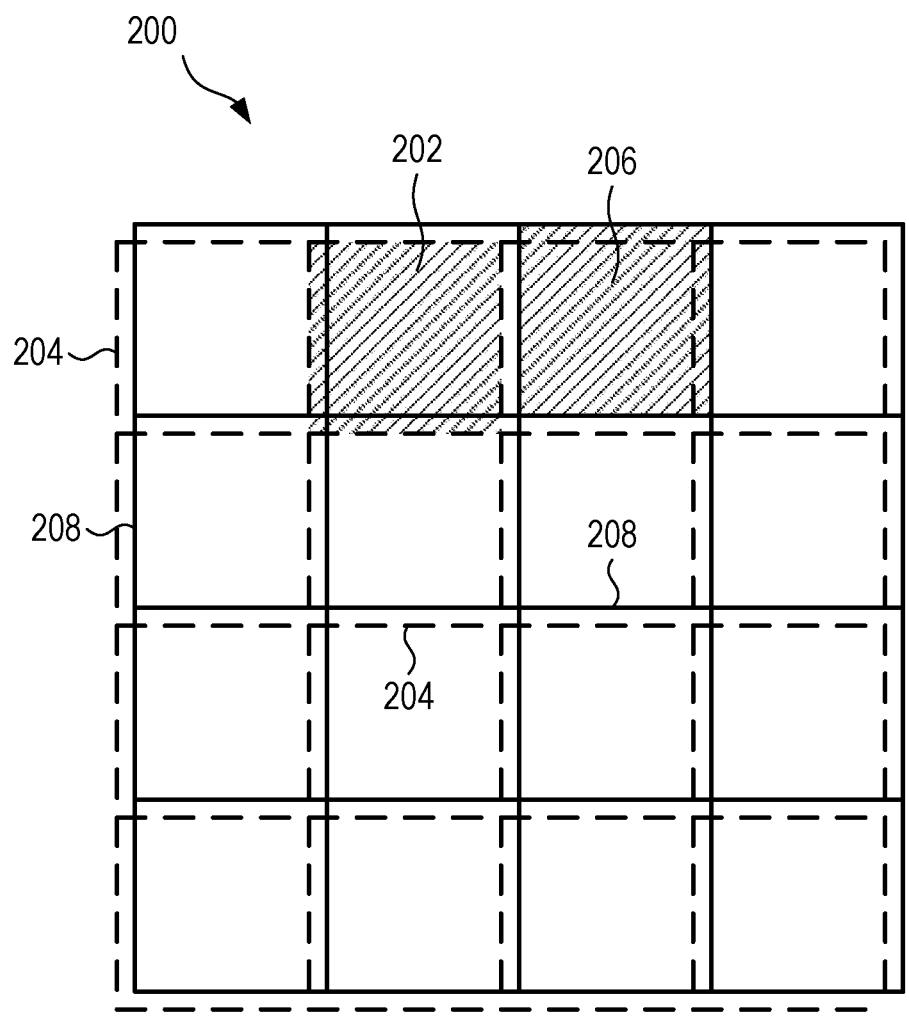
FIG. 2 shows a front view of an example of a dual junction LED array including first and second junctions that extend in a plane, in accordance with some examples.
Figure 3:
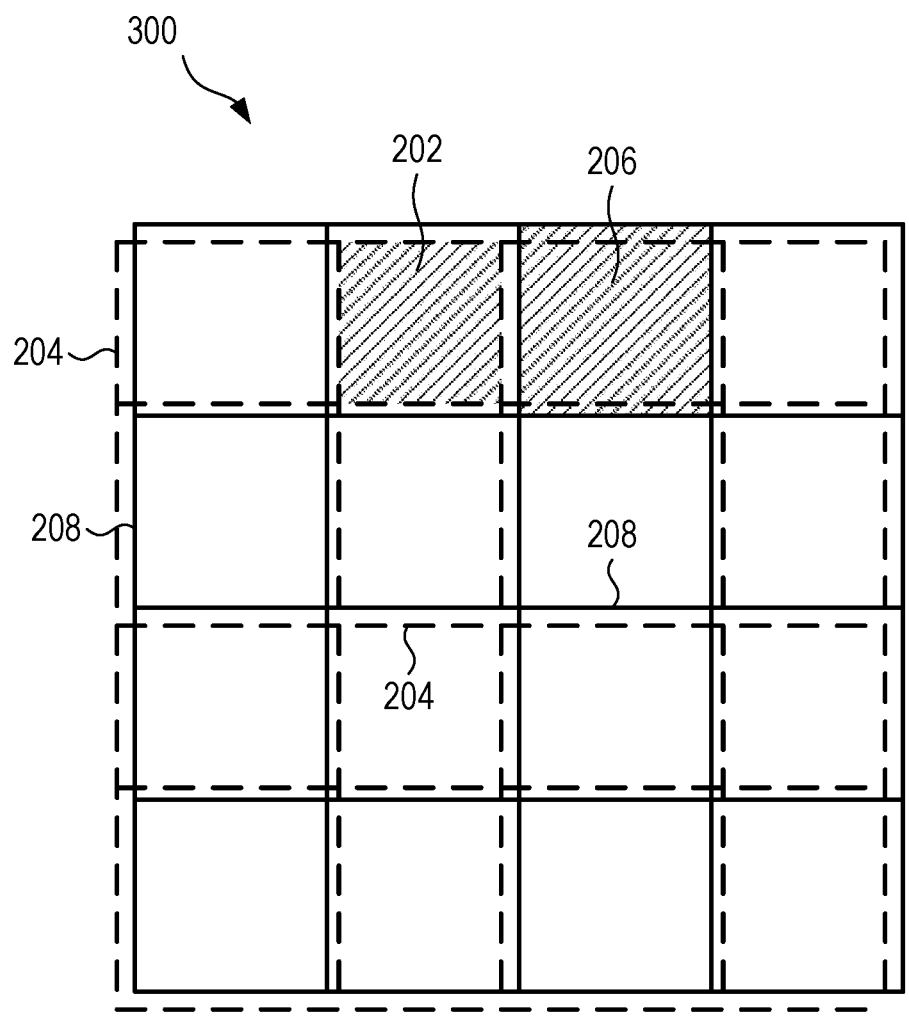
FIG. 3 shows a front view of an example of a dual junction LED array including first and second junctions that extend in a plane, in accordance with some examples.
Figure 4:
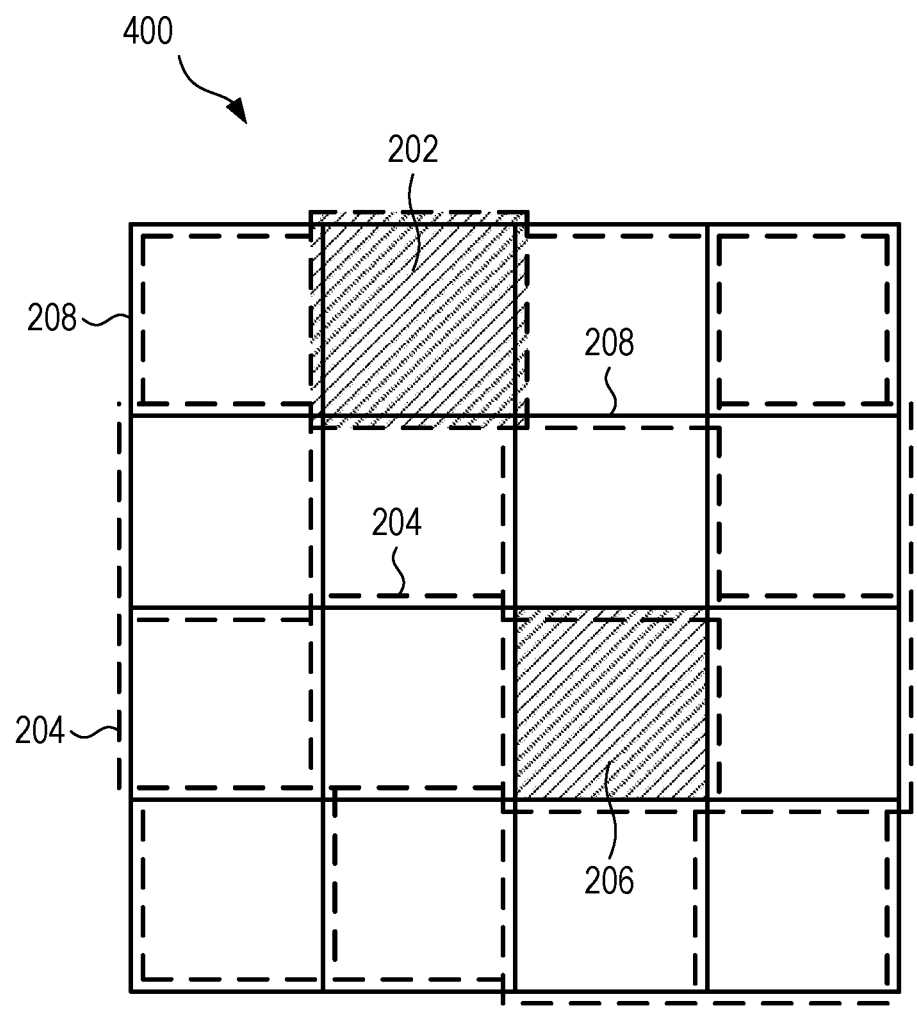
FIG. 4 shows a front view of an example of a dual junction LED array including first and second junctions that extend in a plane, in accordance with some examples.

FIG. 2 shows a front view of an example of a dual junction LED array 200 including first and second junctions that extend in a plane (e.g., in a plane of the page of FIG. 2), in accordance with some examples. FIG. 3 shows a front view of an example of a dual junction LED array 300 including first and second junctions that extend in a plane (e.g., in a plane of the page of FIG. 3), in accordance with some examples. FIG. 4 shows a front view of an example of a dual-junction LED array 400 including first and second junctions that extend in a plane (e.g., in a plane of the page of FIG. 4), in accordance with some examples. In the views of FIGS. 2-4, the first junction is parallel to the plane of the page, and the second junction is disposed between the first junction and the viewer.

The first junction can emit first light from a plurality of first light-emitting areas 202 that are separated by first boundaries 204. The second junction can be disposed on the first junction such that the first light passes through the second junction. The second junction can emit second light from a plurality of second light-emitting areas 206. The second light-emitting areas 206 can be separated by second boundaries 208 that correspond in a one-to-one correspondence to the first boundaries 204. The second boundaries 208 can be offset in the plane from the corresponding first boundaries 204. The offset can help reduce or eliminate dark bands in the combined first and second light, which could be present if the second boundaries 208 were not offset from the first boundaries 204.

In some examples, the plurality of second light-emitting areas 206 can correspond in a one-to-one correspondence to the plurality of first light-emitting areas 202. In some examples, each first light-emitting area 202 can emit first light that passes through at least part of the corresponding second light-emitting area 206, and, optionally, through a second boundary 208 that is adjacent to the corresponding second light-emitting area 206.

In some examples, the first boundaries 204 can be parallel to the second boundaries 208. For example, the first boundaries 204 can include boundaries that extend along a first direction and boundaries that extend along a second direction that is orthogonal to the first direction. The second boundaries 208 can also include boundaries that extend along the first direction and the second direction.

In some examples, the plurality of first light-emitting areas 202 can be arranged in a first rectilinear array along orthogonal first and second dimensions. In some examples, each first boundary 204 can be arranged as an elongated area that extends along one of the first or second dimensions. In some examples, the plurality of second light-emitting areas 206 can be arranged in a second rectilinear array along the first and second dimensions. In some examples, each second boundary 208 can be arranged as an elongated area that extends along one of the first or second dimensions.

In some examples, such as the configurations of FIGS. 2 and 3, at least one first boundary 204 can extend in an unbroken line along a full extent of the first rectilinear array.

In some examples, such as the configuration of FIG. 4, at least one first boundary 204 can include a discontinuity. For example, the first boundary 204 can include a first segment and a second segment laterally offset from the first segment. In some examples, such as the configuration of FIG. 4, the at least one first boundary 204 can include a plurality of segments that are parallel.

In some examples, such as the configurations of FIGS. 2 and 3, at least one second boundary 208 can extend in an unbroken line along a full extent of the second rectilinear array.

In some examples, such as the configuration of FIG. 4, at least one second boundary 208 can include a discontinuity. In some examples, such as the configuration of FIG. 4, the at least one second boundary 208 can include a plurality of segments that are parallel.

In some examples, each first light-emitting area 202 can be electrically connected in series to the corresponding second light-emitting area 206, such that an applied current causes the first light-emitting area 202 and the corresponding second light-emitting area 206 to produce light simultaneously.

In some examples, each first light emitting area 202 can be electrically powerable independent of other first light-emitting areas 202 of the plurality of first light-emitting areas 202. In some examples, a subset of first light emitting areas 202 can be electrically powerable independent of other subsets of first light-emitting areas 202 of the plurality of first light-emitting areas 202. In some examples, each second light emitting area 206 can be electrically powerable independent of other second light-emitting areas 206 of the plurality of second light-emitting areas 206. In some examples, a subset of second light emitting areas 206 can be electrically powerable independent of other subsets of second light-emitting areas 206 of the plurality of second light-emitting areas 206.

FIGS. 5-16 show cross-sectional side views of an example of a dual-junction LED array in various stages of manufacture, in accordance with some examples. In FIGS. 5-16, elements are numbered in the figure in which they initially appear or are modified, but are not numbered in subsequent figures for clarity.

Figure 5:
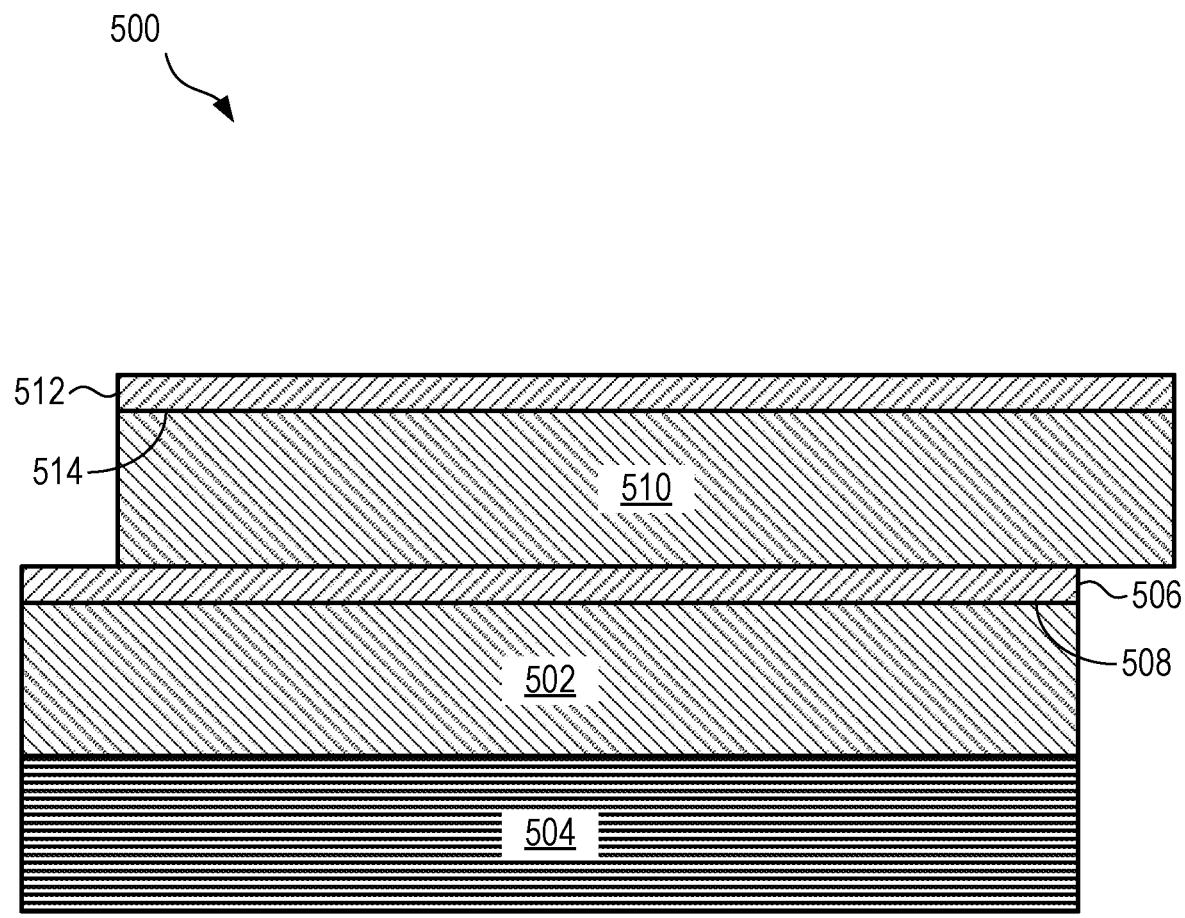
FIG. 5 shows an example of a partially manufactured dual-junction LED array, at which a mirror layer has been deposited, in accordance with some examples.

FIG. 5 shows an example of a partially manufactured dual-junction LED array 500, at which a mirror layer has been deposited, such as a metal mirror or a composite mirror, in accordance with some examples. A first n-doped layer 502 has been deposited or grown on a substrate 504, such as a sapphire substrate. A first p-doped layer 506 has been deposited or grown on the first n-doped layer 502, forming a first junction 508. A second n-doped layer 510 has been deposited or grown on the first p-doped layer 506. A second p-doped layer 512 has been deposited or grown on the second n-doped layer 510, forming a second junction 514. The first n-doped layer 502 and the second n-doped layer 510 can be formed from the same n-doped material or from different n-doped materials. The first p-doped layer 506 and the second p-doped layer 512 can be formed from the same p-doped material or from different p-doped materials.

Figure 6:
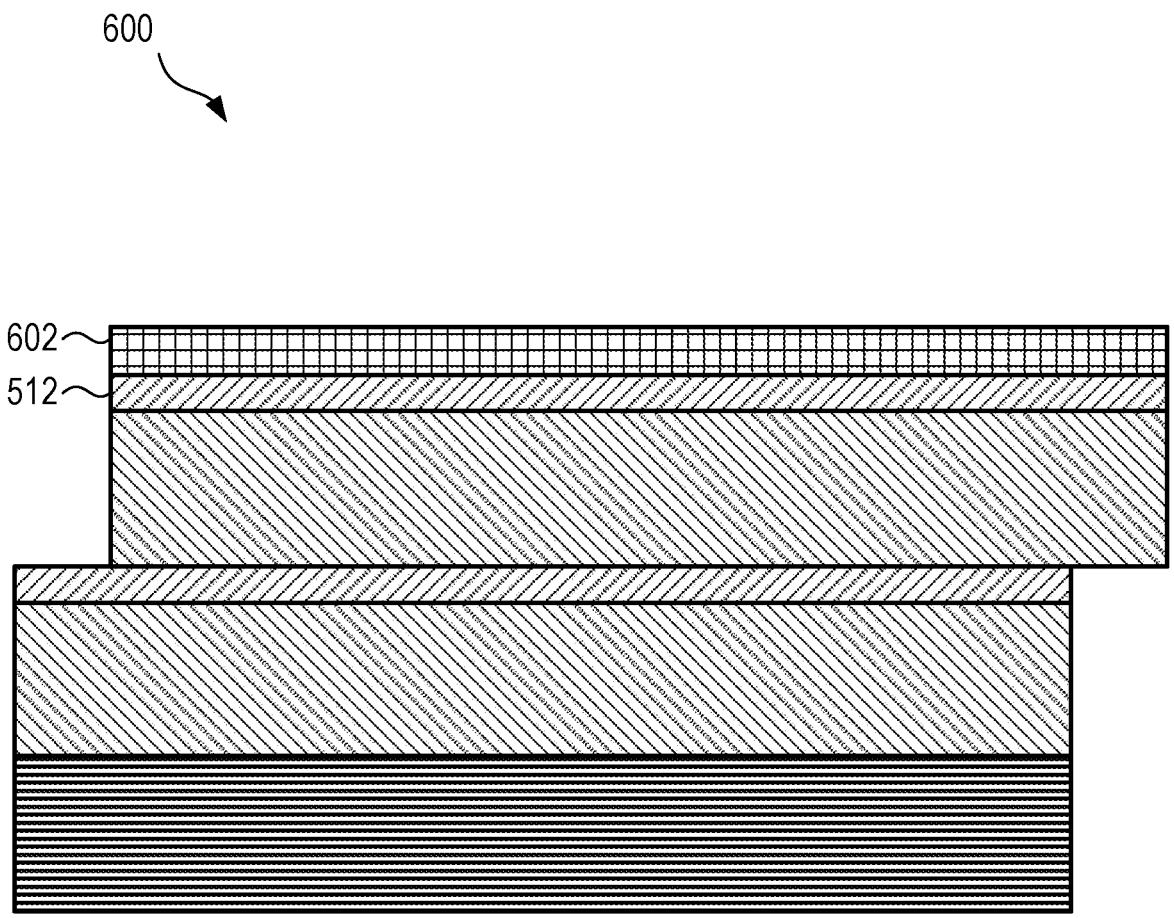
FIG. 6 shows an example of a partially manufactured dual-junction LED array, at which a hardmask has been deposited, in accordance with some examples.

FIG. 6 shows an example of a partially manufactured dual-junction LED array 600, at which a hardmask 602 has been deposited. The hardmask 602 can include a dielectric material, or other suitable material. The hardmask 602 has been deposited on the second p-doped layer 512.

Figure 7:
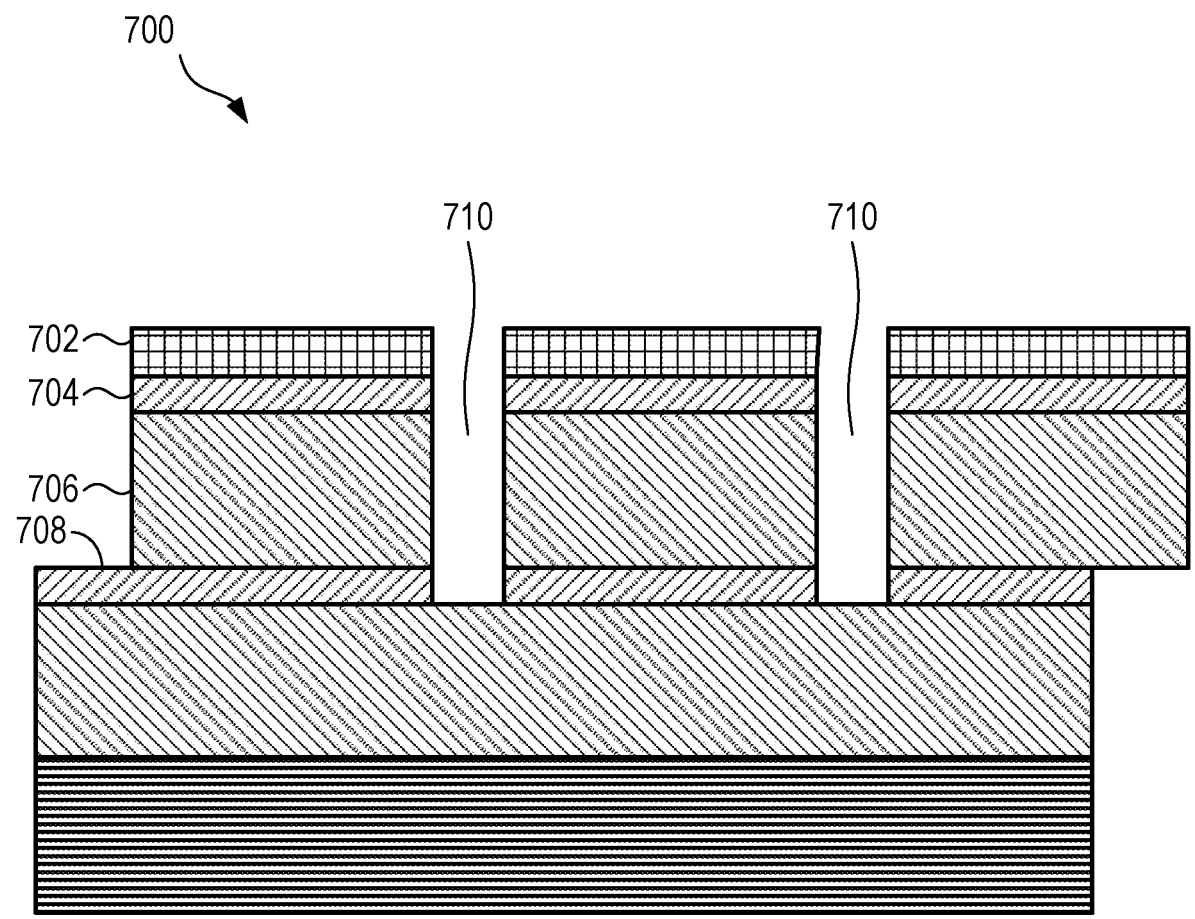
FIG. 7 shows an example of a partially manufactured dual-junction LED array, at which the hardmask has been pattern and etched, in accordance with some examples.

FIG. 7 shows an example of a partially manufactured dual-junction LED array 700, at which the hardmask has been pattern and etched, in accordance with some examples. The hardmask 602 of FIG. 6 has been patterned and etched to form patterned hardmask 702. The etching extends through the second p-doped layer 512 to form a patterned second p-doped layer 704. The etching extends through the second n-doped layer 510 to form a patterned second n-doped layer 706. The etching extends through the first n-doped layer 502 to form a patterned first n-doped layer 708. The etched portions form vias 710.

Figure 8:
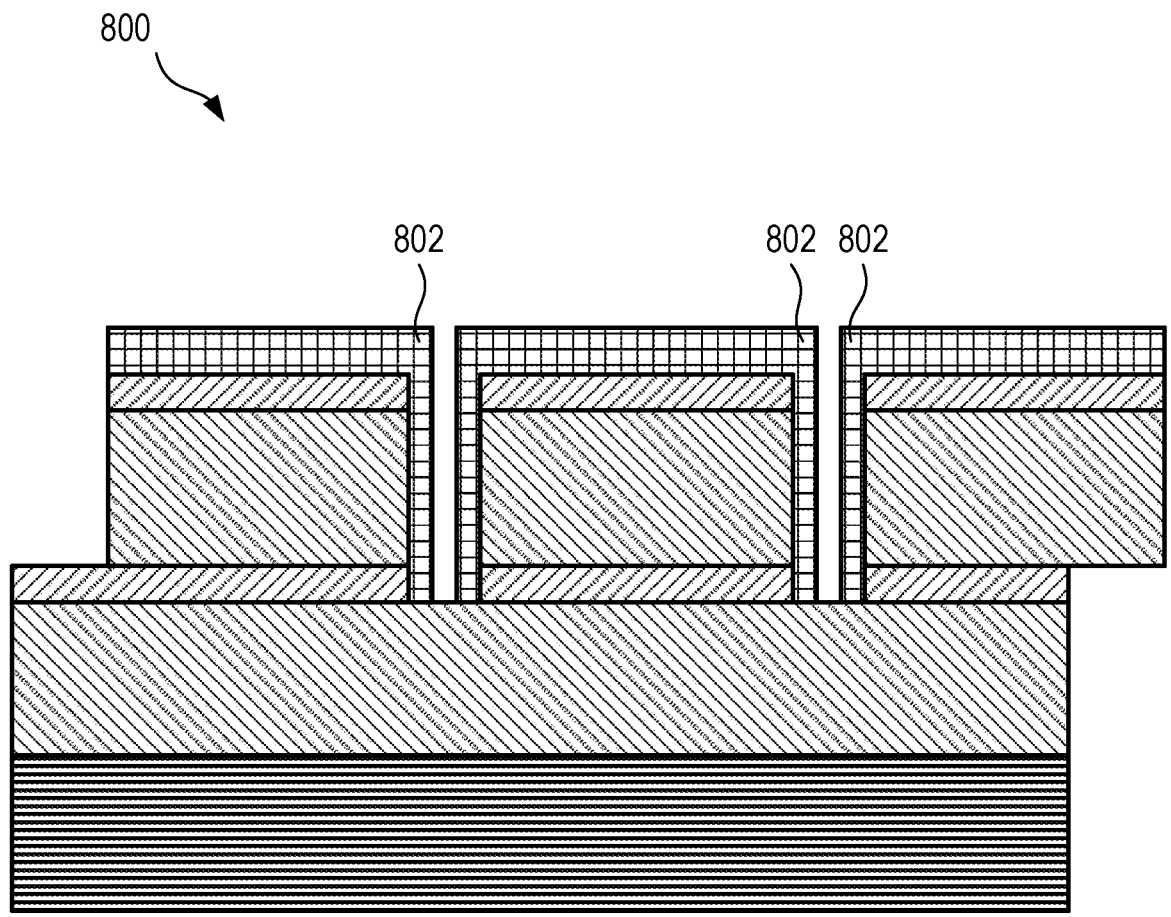
FIG. 8 shows an example of a partially manufactured dual-junction LED array, at which the dielectric spacers have been deposited on sidewalls of the vias, in accordance with some examples.

FIG. 8 shows an example of a partially manufactured dual-junction LED array 800, at which the dielectric spacers have been deposited on sidewalls of the vias, in accordance with some examples. A dielectric material, such as the dielectric material used to form the hardmask 602, has been deposited on sidewalls of the vias to form dielectric spacers 802. The dielectric material may not be deposited on the bottom of the vias, or may have been deposited and subsequently removed.

Figure 9:
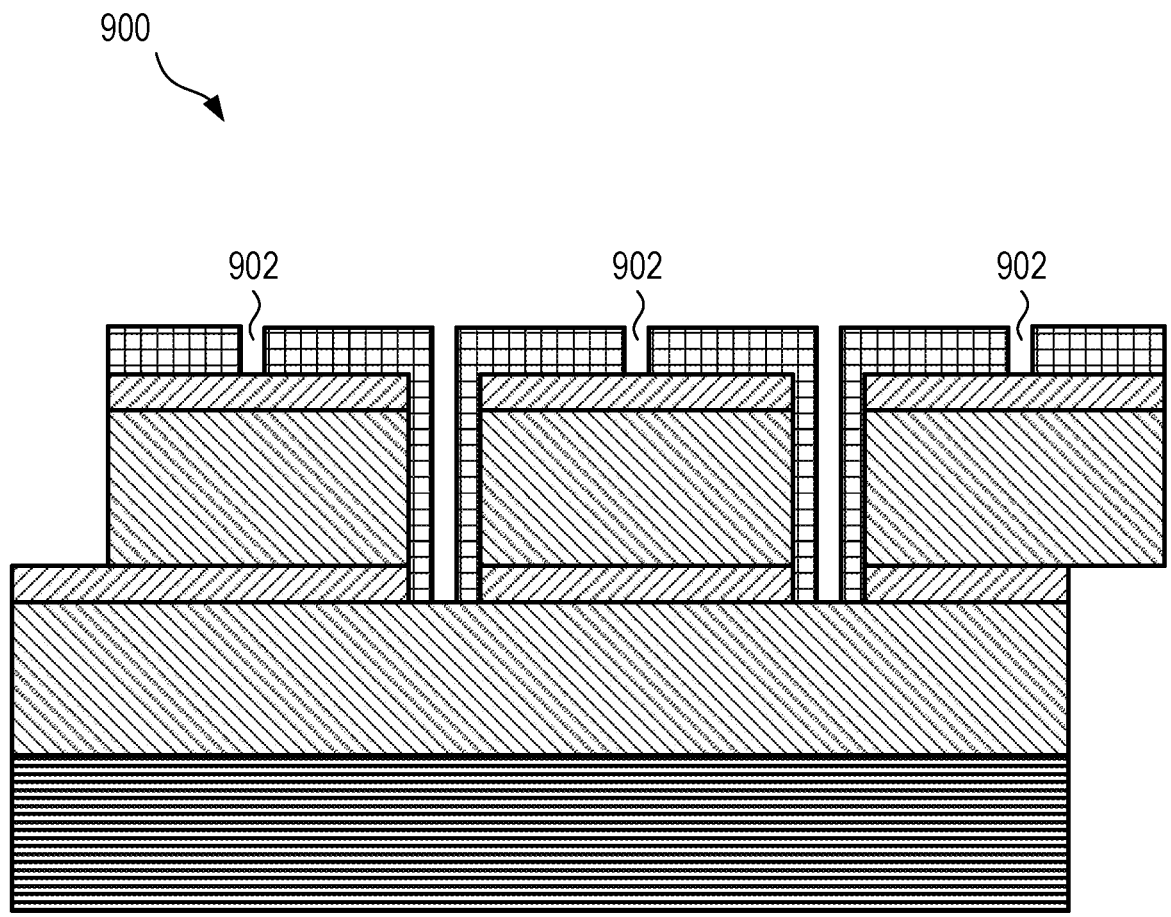
FIG. 9 shows an example of a partially manufactured dual-junction LED array, at which p-vias have been patterned and etched in the hardmask, in accordance with some examples.

FIG. 9 shows an example of a partially manufactured dual-junction LED array 900, at which p-vias have been patterned and etched in the hardmask, in accordance with some examples. The hardmask 602 of FIG. 6 has been patterned and etched to form p-vias 902.

Figure 10:
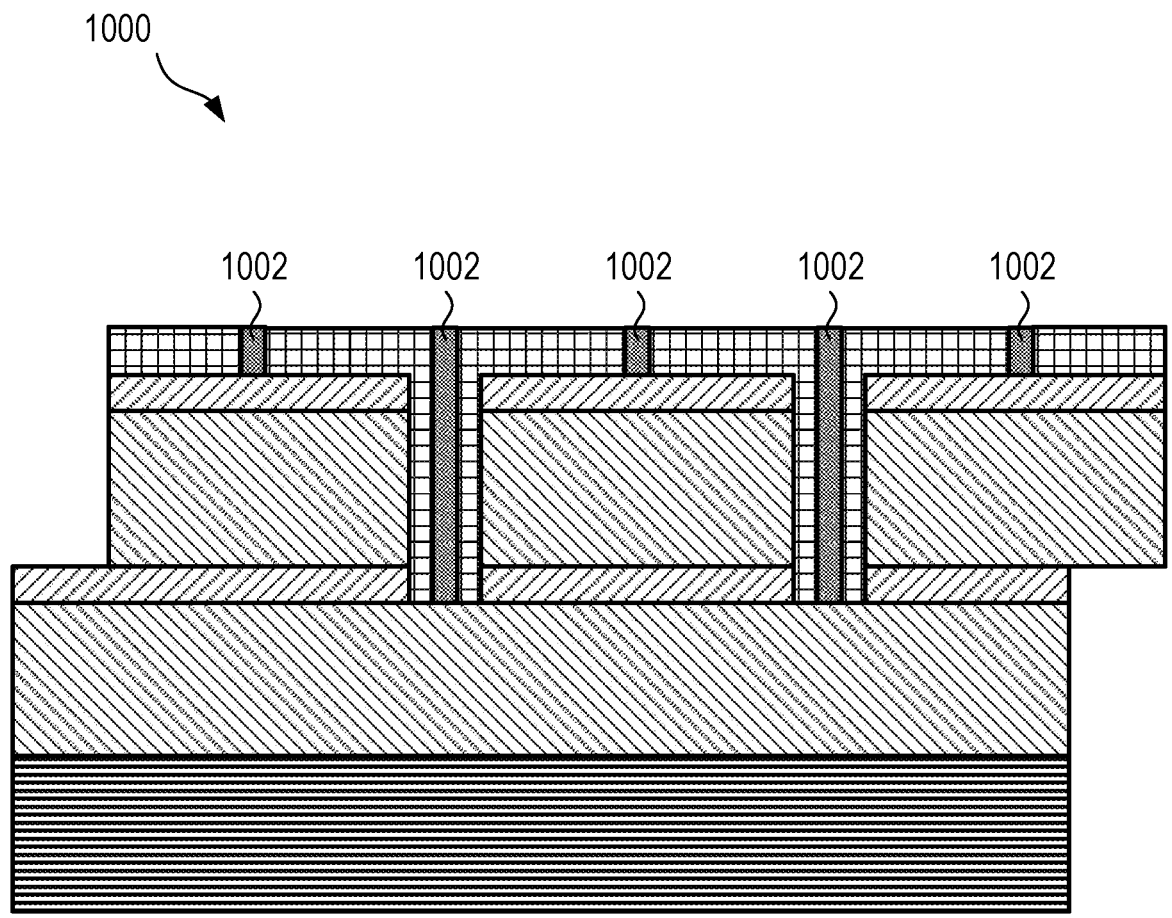
FIG. 10 shows an example of a partially manufactured dual-junction LED array, at which the p-vias and delectric spacers have been filled with metal, in accordance with some examples.

FIG. 10 shows an example of a partially manufactured dual-junction LED array 1000, at which the p-vias and dielectric spacers have been filled with metal, in accordance with some examples. The p-vias 902 of FIG. 6 and the dielectric spacers 802 of FIG. 8 have been filled with a metal to form electrical connections 1002. Such filling can include a depositing of a seed layer, a plate, and chemo-mechanical polishing. Any or all of the metal filling can be performed by evaporation/plating, sputtering, and/or beam epitaxy.

Figure 11:
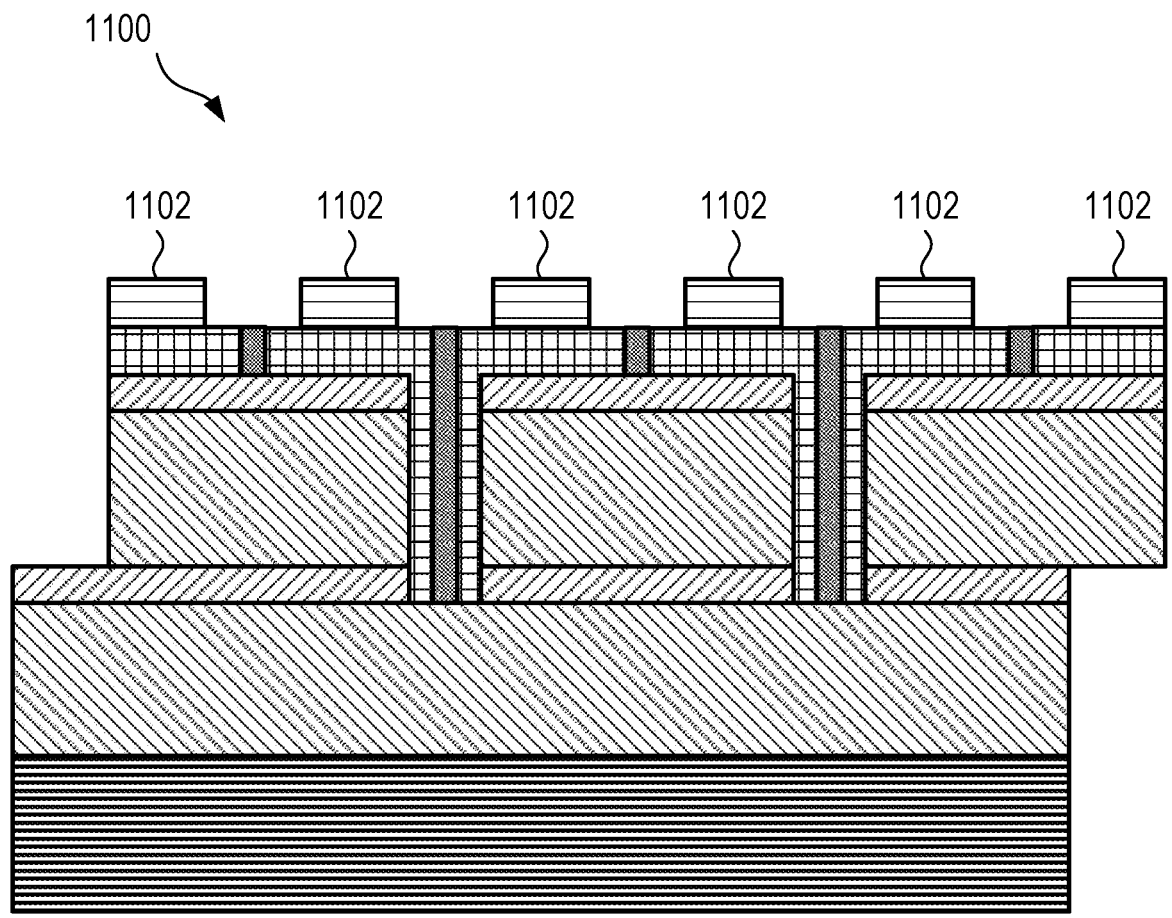
FIG. 11 shows an example of a partially manufactured dual-junction LED array, at which the bonding dielectric has been deposited and patterned, in accordance with some examples.

FIG. 11 shows an example of a partially manufactured dual-junction LED array 1100, at which the bonding dielectric has been deposited and patterned, in accordance with some examples. A bonding dielectric 1102 has been deposited on the hardmask 602 and patterned/etched at locations away from the electrical connections 1002.

Figure 12:
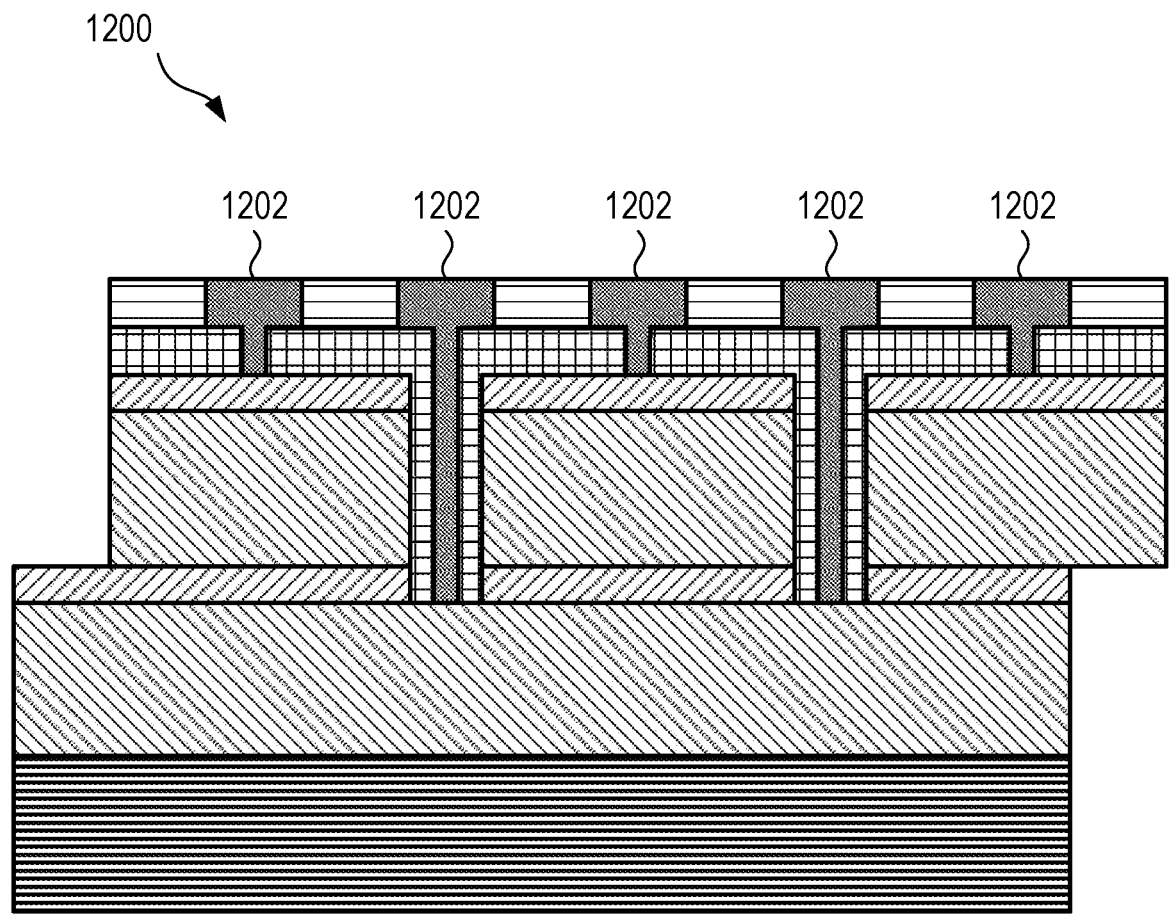
FIG. 12 shows an example of a partially manufactured dual-junction LED array, at which the bond pads have been formed, in accordance with some examples.

FIG. 12 shows an example of a partially manufactured dual-junction LED array 1200, at which the bond pads have been formed, in accordance with some examples. A metal has been deposited in the regions between the bonding delectric 1102 of FIG. 11, to enlarge the surface area of the electrical connections 1002 of FIG. 10 to form the bond pads 1202. Such depositing can include a depositing of a seed layer, a plate, and chemo-mechanical polishing. Any or all of the metal filling can be performed by evaporation/plating, sputtering, and/or beam epitaxy.

Figure 13:
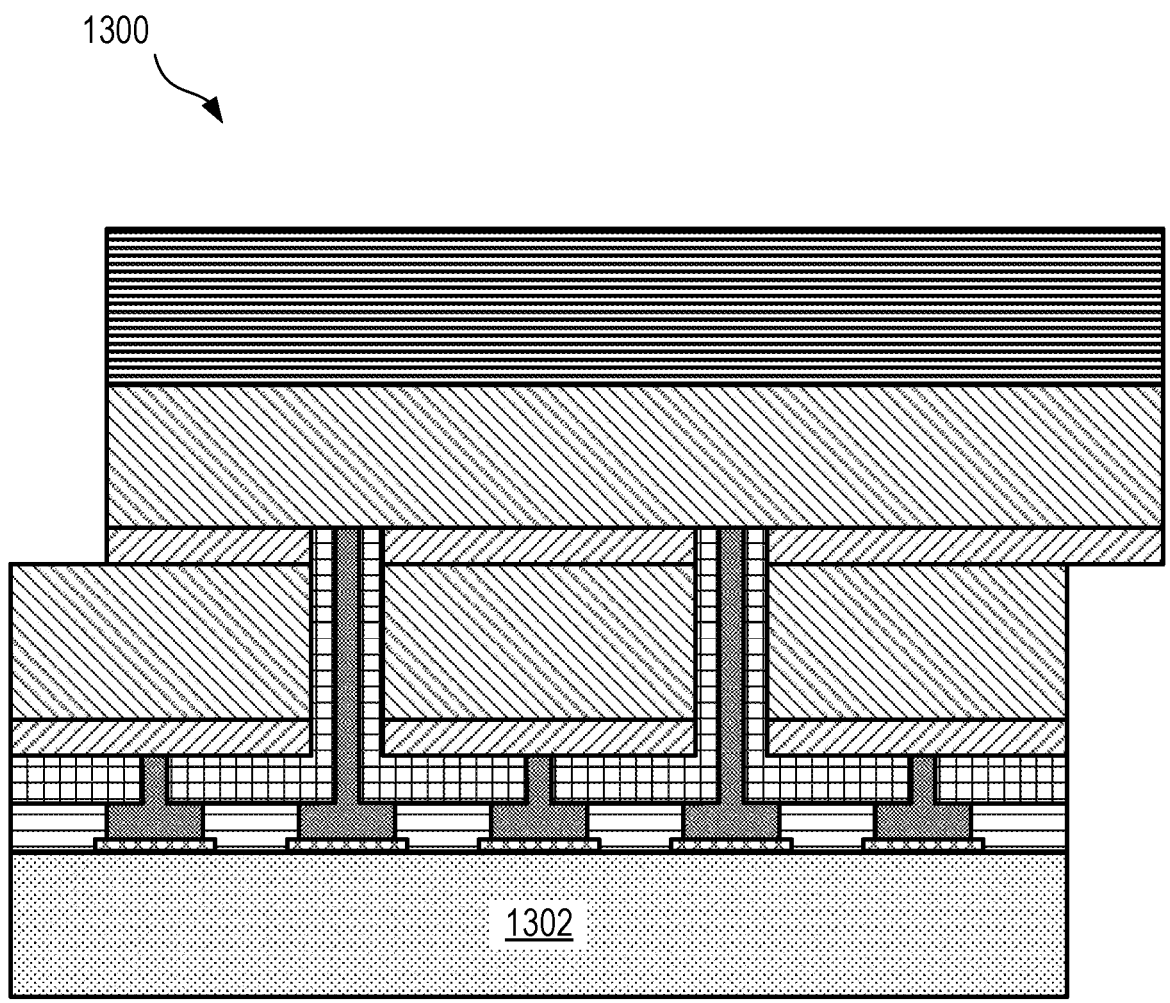
FIG. 13 shows an example of a partially manufactured dual-junction LED array, at which the structure of FIG. 12 has been bonded to a substrate, in accordance with some examples.

FIG. 13 shows an example of a partially manufactured dual-junction LED array 1300, at which the structure of FIG. 12 has been bonded to a substrate, in accordance with some examples. In FIG. 13, the structure of FIG. 12 has been inverted and wafer-to-wafer bonded to a patterned substrate 1302. The bonding can include hybrid bonding.

Figure 14:
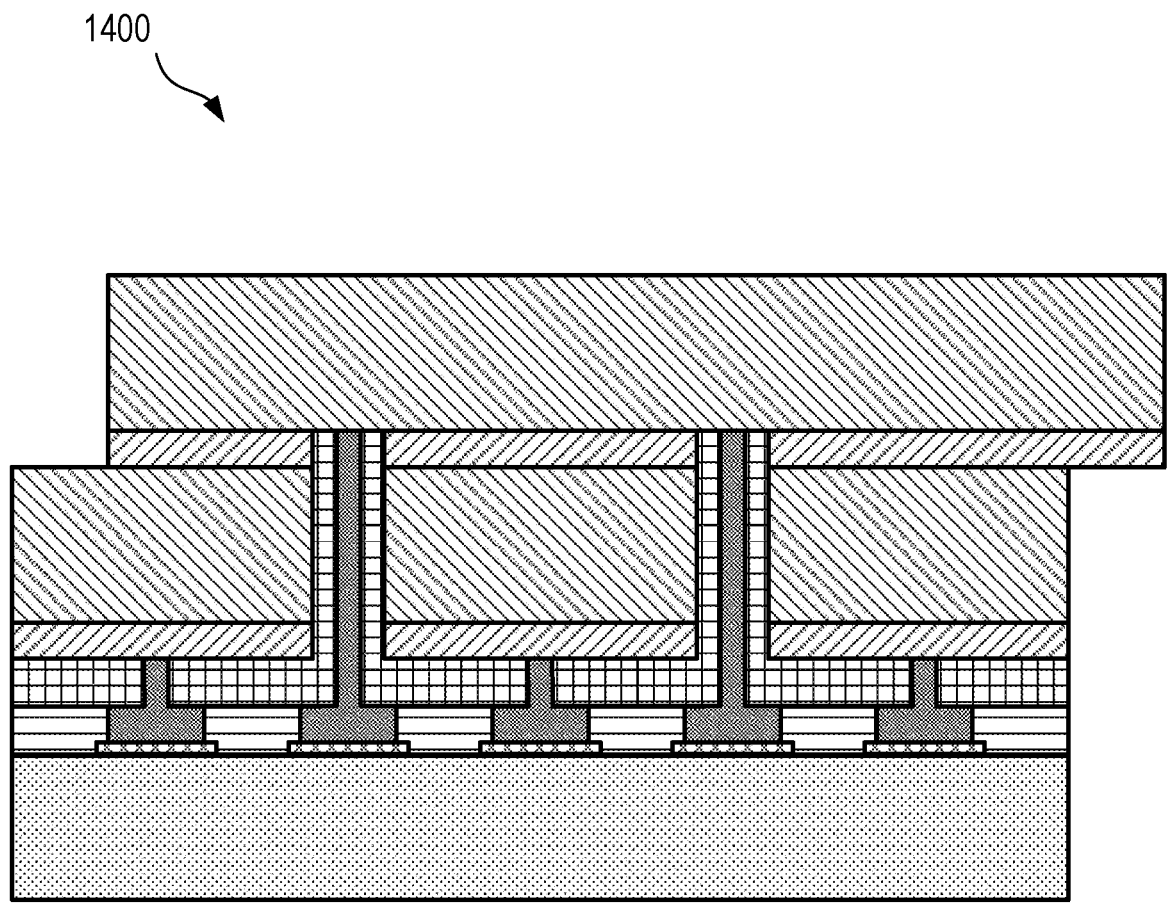
FIG. 14 shows an example of a partially manufactured dual-junction LED array, at which the substrate has been removed, in accordance with some examples.

FIG. 14 shows an example of a partially manufactured dual-junction LED array 1400, at which the substrate 504 has been removed, in accordance with some examples. The substrate 504 of FIG. 5, such as the sapphire substrate, has been removed, such as by laser liftoff. Such liftoff can be a wafer-level laser liftoff of the growth substrate, such as 504. Patterned roughening can optionally be performed.

Figure 15:
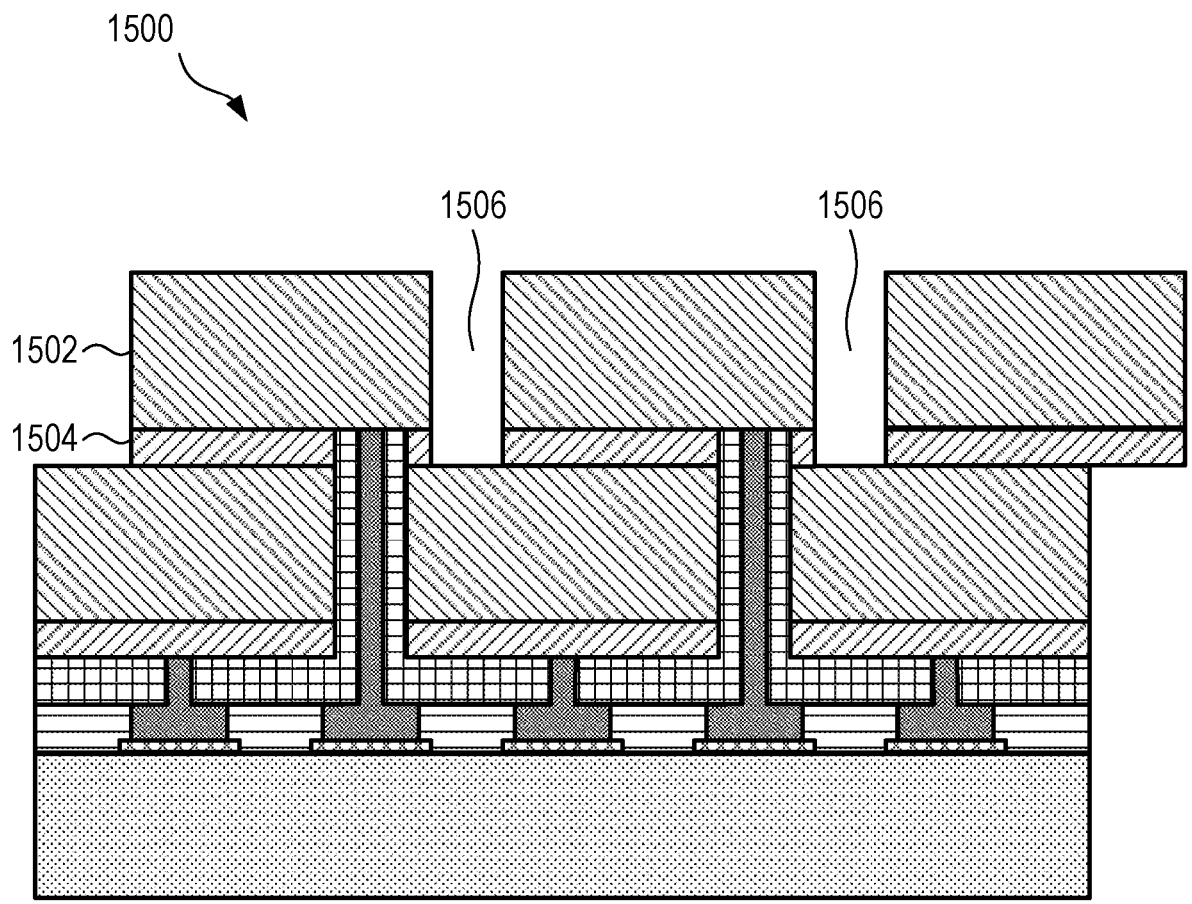
FIG. 15 shows an example of a partially manufactured dual-junction LED array, at which n-side segmentation has been performed, in accordance with some examples.

FIG. 15 shows an example of a partially manufactured dual-junction LED array 1500, at which n-side segmentation has been performed, in accordance with some examples. Segmentation can define where the boundaries occur between light-emitting areas of the final device. The segmentation can be patterned as described above, so that the boundaries of one junction are offset from the boundaries of the other junction. The first n-doped layer 502 of FIG. 5 can be etched to form the patterned first n-doped layer 1502. The first p-doped layer 506 of FIG. 5 can be etched to form the patterned first p-doped layer 1504. The etched portions 1506 in both of these layers can form the segmentation pattern.

Figure 16:
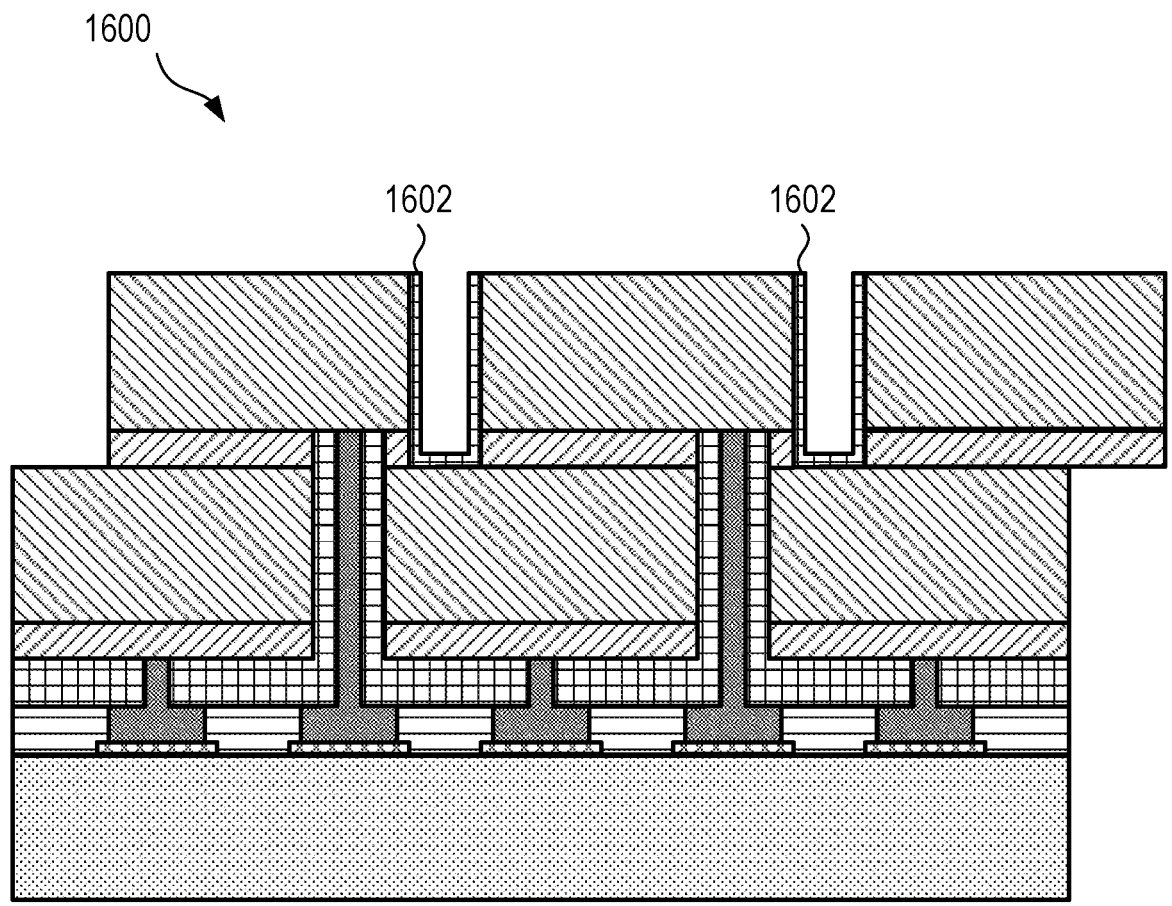
FIG. 16 shows an example of a partially manufactured dual-junction LED array, at which the etched portions have been passivated, in accordance with some examples.

FIG. 16 shows an example of a partially manufactured dual-junction LED array 1600, at which the etched portions have been passivated, in accordance with some examples. The etched portions 1506 of FIG. 15 have been filled of partially filled (including sidewalls and bottoms) with a dielectric material 1602. Such passivation can electrically isolate one light-emitting area from the other light-emitting areas. The dual-junction LED array 1600 can function as a completed device.

In some examples, the dual junction can optionally be covered by a wavelength converting layer, such as a phosphor. The dual junction can produce first light having a first wavelength, such as in the blue or violet portion of the visible spectrum. The wavelength converting layer can absorb some or all of the first light and emit second light having a second wavelength that is greater than the first wavelength, such as in the yellow portion of the visible spectrum. The full light output can be the second light, or a combination of the first light and the second light. In some examples, the phosphor and the geometry of the dual junction can be tailored to output light having a specified peak wavelength and/or a specified wavelength spectrum.

Figure 17:
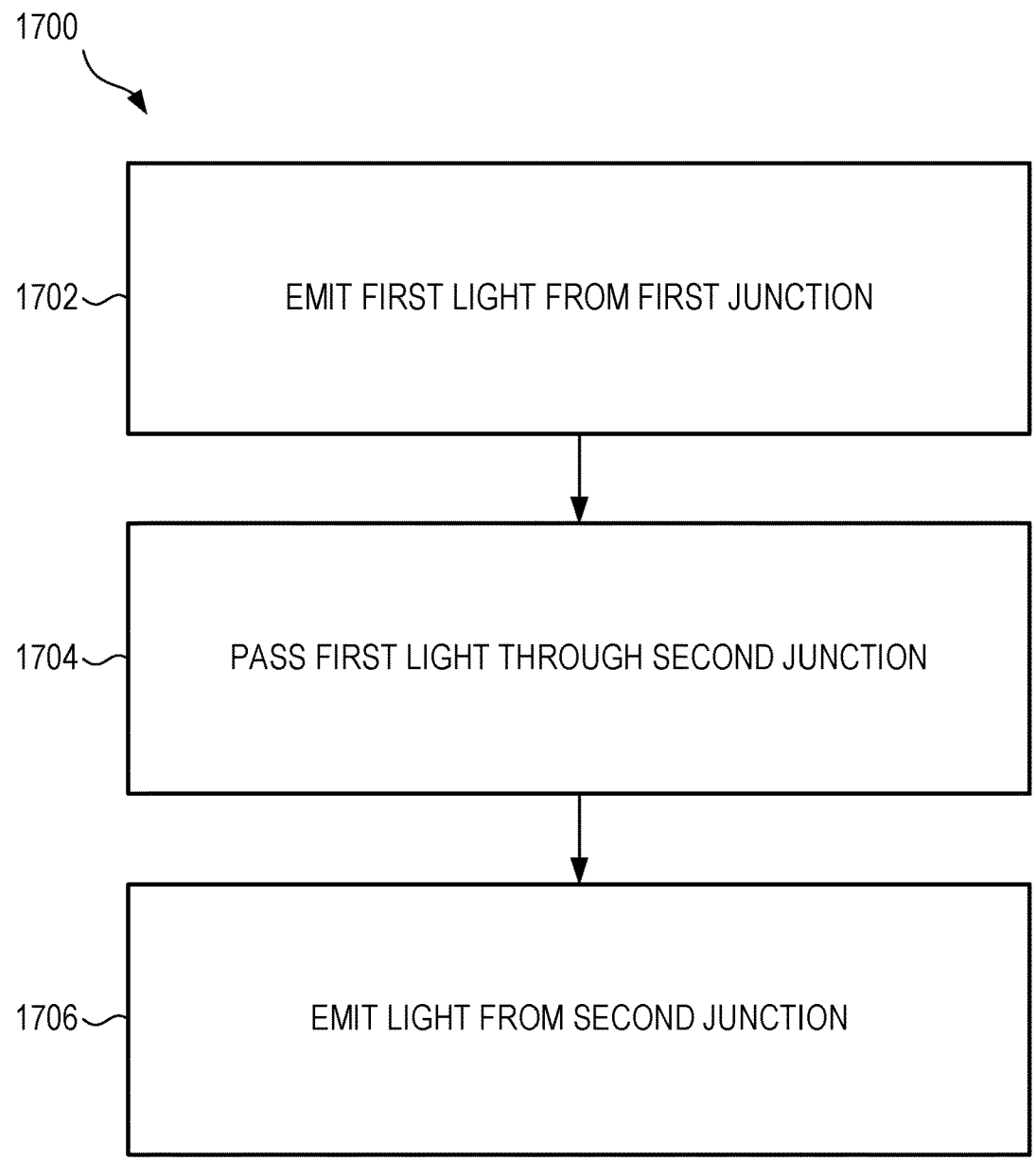
FIG. 17 shows a flowchart of an example of a method for providing illumination, in accordance with some examples.

FIG. 17 shows a flowchart of an example of a method 1700 for providing illumination, in accordance with some examples. The method 1700 can be executed by the illumination system 100 of FIG. 1, or by any suitable illumination system. The method 1700 is but one example of a method for providing illumination. Other methods can also be used.

At operation 1702, first light, such as first light 110, can be emitted from a first junction of a dual junction LED array, such as LED array 106, LED array 200, LED array 300, or LED array 400, from a plurality of first light-emitting areas, such as first light-emitting areas 202, that extend in a plane and are separated by first boundaries, such as first boundaries 204.

At operation 1704, the first light can be passed through a second junction of the dual junction LED array.

At operation 1706, second light, such as second light 112, can be emitted from the second junction from a plurality of second light-emitting areas, such as second light-emitting areas 206, that correspond in a one-to-one correspondence to the plurality of first light-emitting areas. The plurality of second light-emitting areas can be separated by second boundaries, such as second boundaries 208, that are offset in the plane from the first boundaries. In some examples, the first boundaries can be parallel to the second boundaries.

In some examples, each first light-emitting area can be electrically connected in series to the corresponding second light-emitting area, such that the first light-emitting area and the corresponding second light-emitting area can produce light simultaneously in response to an applied current. In other examples, each first light-emitting area and the corresponding second light-emitting area can be electrically powered independently.

In some examples, each first light emitting area can be electrically powerable independent of other first light-emitting areas of the plurality of first light-emitting areas. In some examples, each second light emitting area can be electrically powerable independent of other second light-emitting areas of the plurality of second light-emitting areas.

The system and method are applicable to adaptive flash for mobile devices, steerable illumination for automotive/industry applications, and others.

To further illustrate the systems and related methods disclosed herein, a non-limiting list of examples is provided below. Each of the following non-limiting examples can stand on its own or can be combined in any permutation or combination with any one or more of the other examples.

In Example 1, an illumination system can include a dual junction light-emitting diode (LED) array including a first junction and a second junction that extend in a plane. The first junction can emit first light from a plurality of first light-emitting areas. The first light-emitting areas can be separated by first boundaries. The second junction can be disposed on the first junction such that the first light passes through the second junction. The second junction can emit second light from a plurality of second light-emitting areas. The second light-emitting areas can be separated by second boundaries that correspond in a one-to-one correspondence to the first boundaries. The second boundaries can be offset in the plane from the corresponding first boundaries.

In Example 2, the illumination system of Example 1 can optionally be configured such that: the plurality of second light-emitting areas corresponds in a one-to-one correspondence to the plurality of first light-emitting areas; and each first light-emitting area is configured to emit first light that passes through at least part of the corresponding second light-emitting area.

In Example 3, the illumination system of any one of Examples 1-2 can optionally be configured such that each first light-emitting area is configured to emit first light that passes through at least part of the corresponding second light-emitting area and through a second boundary that is adjacent to the corresponding second light-emitting area.

In Example 4, the illumination system of any one of Examples 1-3 can optionally be configured such that each first light-emitting area is electrically connected in series to the corresponding second light-emitting area, such that an applied current causes the first light-emitting area and the corresponding second light-emitting area to produce light simultaneously.

In Example 5, the illumination system of any one of Examples 1-4 can optionally be configured such that: each first light emitting area is electrically powerable independent of other first light-emitting areas of the plurality of first light-emitting areas; and each second light emitting area is electrically powerable independent of other second light-emitting areas of the plurality of second light-emitting areas.

In Example 6, the illumination system of any one of Examples 1-5 can optionally be configured such that the first boundaries are parallel to the second boundaries.

In Example 7, the illumination system of any one of Examples 1-6 can optionally be configured such that: the plurality of first light-emitting areas is arranged in a first rectilinear array along orthogonal first and second dimensions; each first boundary is arranged as an elongated area that extends along one of the first or second dimensions; the plurality of second light-emitting areas is arranged in a second rectilinear array along the first and second dimensions; and each second boundary is arranged as an elongated area that extends along one of the first or second dimensions.

In Example 8, the illumination system of any one of Examples 1-7 can optionally be configured such that at least one first boundary extends in an unbroken line along a full extent of the first rectilinear array.

In Example 9, the illumination system of any one of Examples 1-8 can optionally be configured such that at least one first boundary includes a discontinuity.

In Example 10, the illumination system of any one of Examples 1-9 can optionally be configured such that the at least one first boundary includes a plurality of segments that are parallel.

In Example 11, the illumination system of any one of Examples 1-10 can optionally be configured such that at least one second boundary extends in an unbroken line along a full extent of the second rectilinear array.

In Example 12, the illumination system of any one of Examples 1-11 can optionally be configured such that at least one second boundary includes a discontinuity.

In Example 13, the illumination system of any one of Examples 1-12 can optionally be configured such that the at least one second boundary includes a plurality of segments that are parallel.

In Example 14, the illumination system of any one of Examples 1-13 can optionally further include: a controller configured to selectively power at least one of the first light-emitting areas and at least some of the second light-emitting areas in response to distance to objects in a scene; a lens configured to direct the first light and the second light toward the scene as illumination; and a camera configured to collect illumination that is reflected from the scene to form an image of the scene.

In Example 15, the illumination system of any one of Examples 1-14 can optionally further include: a flash for the camera, the flash including the dual-junction LED array and the lens; and a housing that includes the flash, the camera, and the controller.

In Example 16, a method for providing illumination can include: emitting first light from a first junction of a dual junction light-emitting diode (LED) array from a plurality of first light-emitting areas that extend in a plane and are separated by first boundaries; passing the first light through a second junction of the dual junction LED array; and emitting second light from the second junction from a plurality of second light-emitting areas that correspond in a one-to-one correspondence to the plurality of first light-emitting areas, the plurality of second light-emitting areas being separated by second boundaries that are offset in the plane from the first boundaries.

In Example 17, the method of Example 16 can optionally be configured such that each first light-emitting area is electrically connected in series to the corresponding second light-emitting area, such that the first light-emitting area and the corresponding second light-emitting area are configured to produce light simultaneously in response to an applied current.

In Example 18, the method of any one of Examples 16-17 can optionally be configured such that: each first light emitting area is electrically powerable independent of other first light-emitting areas of the plurality of first light-emitting areas; and each second light emitting area is electrically powerable independent of other second light-emitting areas of the plurality of second light-emitting areas.

In Example 19, the method of any one of Examples 16-18 can optionally be configured such that the first boundaries are parallel to the second boundaries.

In Example 20, an illumination system can include a dual junction light-emitting diode (LED) array including a first junction and a second junction that extend in a plane. The first junction can emit first light from a plurality of first light-emitting areas. The first light-emitting areas can be separated by first boundaries. The second junction can be disposed on the first junction such that the first light passes through the second junction. The second junction can emit second light from a plurality of second light-emitting areas.

The plurality of second light-emitting areas can correspond in a one-to-one correspondence to the plurality of first light-emitting areas. Each first light-emitting area can emit first light that passes through at least part of the corresponding second light-emitting area. Each first light-emitting area can be electrically connected in series to the corresponding second light-emitting area, such that the first light-emitting area can produce the first light and the corresponding second light-emitting area can produce the second light simultaneously in response to an applied current. The second light-emitting areas can be separated by second boundaries that correspond in a one-to-one correspondence to the first boundaries. The second boundaries can be offset in the plane from the corresponding first boundaries. The illumination system can further include a lens that can direct the first light and the second light toward a scene as illumination. The illumination system can further include a camera that can collect illumination that is reflected from the scene to form an image of the scene.

In Example 21, an illumination system can include a processor; memory including instructions that, when executed by the processor, cause the processor to perform operations, the operations including: emitting first light from a first junction of a dual-junction light-emitting diode (LED) array from a plurality of first light-emitting areas that extend in a plane and are separated by first boundaries; passing the first light through a second junction of the dual-junction LED array; and emitting second light from the second junction from a plurality of second light-emitting areas that correspond in a one-to-one correspondence to the plurality of first light-emitting areas, the plurality of second light-emitting areas being separated by second boundaries that are offset in the plane from the first boundaries.

In Example 22, the illumination system of Example 21 can optionally include the limitations of any one of Examples 1-20.

While only certain features of the system and method have been illustrated and described herein, many modifications and changes will occur to those skilled in the art. It is, therefore, to be understood that the appended claims are intended to cover all such modifications and changes. Method operations can be performed substantially simultaneously or in a different order.

What is claimed is:

1. An illumination system, comprising:
   a dual junction light-emitting diode (LED) array including a first junction and a second junction that extend in a plane,
   the first junction configured to emit first light from a plurality of first light-emitting areas,
   the first light-emitting areas being separated by first boundaries,
   the second junction disposed on the first junction such that the first light passes through the second junction,
   the second junction configured to emit second light from a plurality of second light-emitting areas,
   the second light-emitting areas being separated by second boundaries that correspond in a one-to-one correspondence to the first boundaries,
   the second boundaries being offset in the plane from the corresponding first boundaries.

2. The illumination system of claim 1, wherein:
   the plurality of second light-emitting areas corresponds in a one-to-one correspondence to the plurality of first light-emitting areas; and
   each first light-emitting area is configured to emit first light that passes through at least part of the corresponding second light-emitting area.

3. The illumination system of claim 2, wherein each first light-emitting area is configured to emit first light that passes through at least part of the corresponding second light-emitting area and through a second boundary that is adjacent to the corresponding second light-emitting area.

4. The illumination system of claim 2, wherein each first light-emitting area is electrically connected in series to the corresponding second light-emitting area, such that an applied current causes the first light-emitting area and the corresponding second light-emitting area are to produce light simultaneously.

5. The illumination system of claim 4, wherein:
   each first light emitting area is electrically powerable independent of other first light-emitting areas of the plurality of first light-emitting areas; and
   each second light emitting area is electrically powerable independent of other second light-emitting areas of the plurality of second light-emitting areas.

6. The illumination system of claim 1, wherein the first boundaries are parallel to the second boundaries.

7. The illumination system of claim 1, wherein:
   the plurality of first light-emitting areas is arranged in a first rectilinear array along orthogonal first and second dimensions;
   each first boundary is arranged as an elongated area that extends along one of the first or second dimensions;
   the plurality of second light-emitting areas is arranged in a second rectilinear array along the first and second dimensions; and
   each second boundary is arranged as an elongated area that extends along one of the first or second dimensions.

8. The illumination system of claim 7, wherein at least one first boundary extends in an unbroken line along a full extent of the first rectilinear array.

9. The illumination system of claim 7, wherein at least one first boundary includes a discontinuity.

10. The illumination system of claim 9, wherein the at least one first boundary includes a plurality of segments that are parallel.

11. The illumination system of claim 7, wherein at least one second boundary extends in an unbroken line along a full extent of the second rectilinear array.

12. The illumination system of claim 7, wherein at least one second boundary includes a discontinuity.

13. The illumination system of claim 12, wherein the at least one second boundary includes a plurality of segments that are parallel.

14. The illumination system of claim 1, further comprising:
   a controller configured to selectively power at least one of the first light-emitting areas and at least some of the second light-emitting areas in response to distance to objects in a scene;
   a lens configured to direct the first light and the second light toward the scene as illumination; and
   a camera configured to collect illumination that is reflected from the scene to form an image of the scene.

15. The illumination system of claim 14, further comprising:
   a flash for the camera, the flash including the dual junction LED array and the lens; and
   a housing that includes the flash, the camera, and the controller.

16. A method for providing illumination, the method comprising:
emitting first light from a first junction of a dual junction light-emitting diode (LED) array from a plurality of first light-emitting areas that extend in a plane and are separated by first boundaries;
passing the first light through a second junction of the dual-junction LED array; and
emitting second light from the second junction from a plurality of second light-emitting areas that correspond in a one-to-one correspondence to the plurality of first light-emitting areas, the plurality of second light-emitting areas being separated by second boundaries that are offset in the plane from the first boundaries.

17. The method of claim 16, wherein each first light-emitting area is electrically connected in series to the corresponding second light-emitting area, such that the first light-emitting area and the corresponding second light-emitting area are configured to produce light simultaneously in response to an applied current.

18. The method of claim 16, wherein:
each first light emitting area is electrically powerable independent of other first light-emitting areas of the plurality of first light-emitting areas; and
each second light emitting area is electrically powerable independent of other second light-emitting areas of the plurality of second light-emitting areas.

19. The method of claim 16, wherein the first boundaries are parallel to the second boundaries.

20. An illumination system, comprising:
a dual junction light-emitting diode (LED) array including a first junction and a second junction that extend in a plane,
the first junction configured to emit first light from a plurality of first light-emitting areas,
the first light-emitting areas being separated by first boundaries,
the second junction disposed on the first junction such that the first light passes through the second junction,
the second junction configured to emit second light from a plurality of second light-emitting areas,
the plurality of second light-emitting areas corresponding in a one-to-one correspondence to the plurality of first light-emitting areas,
each first light-emitting area being configured to emit first light that passes through at least part of the corresponding second light-emitting area,
each first light-emitting area being electrically connected in series to the corresponding second light-emitting area, such that the first light-emitting area is configured to produce the first light and the corresponding second light-emitting area is configured to produce the second light simultaneously in response to an applied current,
the second light-emitting areas being separated by second boundaries that correspond in a one-to-one correspondence to the first boundaries,
the second boundaries being offset in the plane from the corresponding first boundaries;
a lens configured to direct the first light and the second light toward a scene as illumination; and
a camera configured to collect illumination that is reflected from the scene to form an image of the scene.

* * * * *